US011218644B2

(12) United States Patent
Yun

(10) Patent No.: US 11,218,644 B2
(45) Date of Patent: Jan. 4, 2022

(54) IMAGE-BASED COMPONENT MEASUREMENT SYSTEM USING LIGHT EMITTING DEVICE THAT OUTPUTS VARIABLE WAVELENGTH AND METHOD THEREOF, AND METHOD OF PLANT CULTIVATION METHOD USING THE SAME

(71) Applicant: SHERPA SPACE INC., Daejeon (KR)

(72) Inventor: Choamun Yun, Daejeon (KR)

(*) Notice: Subject to any disclaimer, the term of this patent is extended or adjusted under 35 U.S.C. 154(b) by 38 days.

(21) Appl. No.: 16/282,336

(22) Filed: Feb. 22, 2019

(65) Prior Publication Data

US 2019/0215432 A1 Jul. 11, 2019

Related U.S. Application Data

(63) Continuation of application No. PCT/KR2017/012779, filed on Nov. 13, 2017, and a
(Continued)

(30) Foreign Application Priority Data

Nov. 30, 2016 (KR) .................. 10-2016-0161290
Feb. 27, 2017 (KR) .................. 10-2017-0025423

(51) Int. Cl.
*H04N 5/235* (2006.01)
*H01L 33/50* (2010.01)
(Continued)

(52) U.S. Cl.
CPC ......... *H04N 5/2354* (2013.01); *G01N 21/314* (2013.01); *G01N 21/84* (2013.01);
(Continued)

(58) Field of Classification Search
CPC .. H04N 5/2354; H04N 5/2351; G01N 21/314; G01N 21/84; G01N 21/8851;
(Continued)

(56) References Cited

U.S. PATENT DOCUMENTS

2008/0042554 A1* 2/2008 Komoto ............ G02F 1/133617
313/501
2011/0140224 A1* 6/2011 Kropelnicki ........ H01L 21/2007
257/436
(Continued)

FOREIGN PATENT DOCUMENTS

JP 2015-158439 A 9/2015
JP 2015158439 A * 9/2015
(Continued)

OTHER PUBLICATIONS

Canada OA dated Jan. 7, 2021.

*Primary Examiner* — Amandeep Saini
(74) *Attorney, Agent, or Firm* — Harvest IP Law, LLP

(57) ABSTRACT

The present disclosure relates to an image-based component measurement system using a light unit that outputs a variable wavelength, a method thereof, and a plant cultivation method using the same. More specifically, the present disclosure provides an image-based component measurement system using a light unit that outputs a variable wavelength, a method thereof, and a plant cultivation method using the same, which collect and analyze data based on image information acquired by emitting light having a specific wavelength using a sheet on which a plurality of quantum dots which can be controlled to have a wavelength necessary for measuring a configuration component of a target object are arranged. Thus, the system and methods are able to measure component content contained in the target object
(Continued)

using a low cost and miniaturized device, and cultivate a plant by adjusting content of nutrients of the plant using the measured component content.

8 Claims, 9 Drawing Sheets

Related U.S. Application Data continuation of application No. PCT/KR2017/012778, filed on Nov. 13, 2017.

(51) Int. Cl.
    *G01N 21/88*     (2006.01)
    *G06T 7/521*     (2017.01)
    *G06T 7/73*     (2017.01)
    *G01N 21/31*     (2006.01)
    *G01N 21/84*     (2006.01)

(52) U.S. Cl.
    CPC ......... *G01N 21/8851* (2013.01); *G06T 7/521* (2017.01); *G06T 7/73* (2017.01); *H01L 33/50* (2013.01); *H04N 5/2351* (2013.01); *G01N 2021/8466* (2013.01)

(58) Field of Classification Search
    CPC . G01N 2021/8466; H01L 33/50; G06T 7/521; G06T 7/73
    USPC ...................................................... 382/103
    See application file for complete search history.

(56) References Cited

U.S. PATENT DOCUMENTS

| | | |
|---|---|---|
| 2013/0047503 A1 | 2/2013 | Aikala et al. |
| 2014/0092282 A1* | 4/2014 | Morishita ............. G01J 3/0205 348/262 |
| 2014/0339983 A1 | 11/2014 | Philips |
| 2015/0128488 A1 | 5/2015 | Casper et al. |
| 2015/0192272 A1 | 7/2015 | Berg et al. |
| 2016/0000018 A1 | 1/2016 | Van Elmpt et al. |
| 2016/0040833 A1 | 2/2016 | Zehetner |
| 2017/0122807 A1* | 5/2017 | Kasahara .................. G01J 3/51 |

FOREIGN PATENT DOCUMENTS

| | | |
|---|---|---|
| KR | 10-2004-0010426 A | 1/2004 |
| KR | 10-0883691 A | 2/2009 |
| KR | 10-2010-0124808 A | 11/2010 |
| KR | 10-2012-0055009 A | 5/2012 |
| KR | 10-1185618 A | 9/2012 |
| KR | 10-2012-0120996 A | 11/2012 |
| KR | 10-1230230 B1 | 2/2013 |
| KR | 10-2013-0052306 A | 5/2013 |
| KR | 10-2014-0036799 A | 3/2014 |
| KR | 20140036799 A | 3/2014 |
| KR | 10-2015-0107508 A | 9/2015 |
| KR | 10-2015-0112902 A | 10/2015 |
| TW | 201416610 A | 5/2014 |

* cited by examiner

IMAGE-BASED COMPONENT MEASUREMENT SYSTEM USING LIGHT EMITTING DEVICE THAT OUTPUTS VARIABLE WAVELENGTH AND METHOD THEREOF, AND METHOD OF PLANT CULTIVATION METHOD USING THE SAME

CROSS REFERENCE TO RELATED APPLICATIONS

This application is a continuation application of International Patent Application No. PCT/KR2017/012779, filed on Nov. 13, 2017, which claims priority from Korean Patent Application No. 10-2017-0025423, filed on Feb. 27, 2017, which is now Korean Patent No. 10-1743125, in the Korean Intellectual Property Office, the disclosure of which is incorporated in reference in its entirety; and of International Patent Application No. PCT/KR2017/012778, filed on Nov. 13, 2017, which claims priority from Korean Patent Application No. 10-2016-0161290, filed on Nov. 30, 2016, which is now Korean Patent No. 10-1730965, in the Korean Intellectual Property Office, the disclosure of which is incorporated in reference in its entirety.

TECHNICAL FIELD

The present disclosure relates to an image-based component measurement system using a light unit that outputs a variable wavelength, a method thereof, and a plant cultivation method using the same. More specifically, the present disclosure relates to an image-based component measurement system using a light unit that outputs a variable wavelength, a method thereof, and a plant cultivation method using the same, which collect and analyze data based on image information acquired by emitting light having a specific wavelength using a sheet on which a plurality of quantum dots, which can be controlled to have a wavelength necessary for measuring a configuration component of a target object, are arranged. Thus, of the system and methods are able to measure component content contained in the target object using a low cost and miniaturized device, and cultivate a plant by adjusting content of nutrients of the plant using the measured component content.

BACKGROUND ART

Light is an electromagnetic radiation. A frequency of the light increases in order of a radio wave of a low wavelength band, a microwave, infrared (IR) rays, visible (VIS) rays, ultraviolet rays (UV), X-rays, and the like, depending on a length of the wavelength. Light is widely used for spectroscopic analysis depending on each wavelength band, where the infrared rays are classified into near infrared rays (NIR), medium infrared rays (MIR), and far infrared rays (Far Infrared), and all can be used to measure an energy change due to an absorption-based molecular vibration motion of a material to analyze an object.

In particular, a near-infrared spectroscopic method, which is a technique that utilizes a near-infrared absorptive property of the object to predict components of interest, is widely used not only in agriculture, food, and feed fields, but also in chemical, biochemical, cosmetic, medical, petrochemical, pharmaceutical, polymer, paper and textile fields, and is showing a great value thereof. In order to realize the near-infrared spectroscopic method, various kinds of near-infrared spectroscopic analysis devices have been researched and developed.

SUMMARY OF THE DISCLOSURE

Conventional spectroscopic analysis apparatuses are disadvantageously expensive. As consumer's interest in various foods including plants increases, the components of interest vary depending on regions, environments, or growth conditions. Therefore, it is necessary to analyze the components in order to confirm quality and nutrients required by the consumer.

Since it generally takes a long time to collect and test samples and analyze the components, and an experimental apparatus for analyzing the components is expensive, a non-expert cannot easily perform the analysis of the components. Therefore, there is a need for a device and a method that can perform a simple and low-cost component analysis.

The present disclosure is to solve the above-mentioned problems, and an object of the present disclosure is to provide an image-based component measurement system using a light unit that outputs a variable wavelength, which can measure component content contained in an object using a low cost and miniaturized device by collecting and analyzing data based on image information acquired by emitting light having a specific wavelength using a sheet on which a plurality of controllable quantum dots are arranged so as to have a wavelength necessary for measuring a component of the object, a method thereof, and a plant cultivation method using the same.

The objects of the embodiments of the present disclosure are not limited to the above-mentioned objects, and other objects not mentioned can be clearly understood by those skilled in the technical field to which the present disclosure pertains from the following description.

According to an aspect of the present disclosure, an image-based component measurement system using a light unit that outputs a variable wavelength, comprises a variable wavelength light unit that outputs light having a wavelength necessary for analyzing a component of a target object; an image acquiring unit that acquires image information of the target object; an image analyzing unit that processes an image acquired by the image acquiring unit and analyzes an absorption wavelength and a reflection wavelength of the target object to estimate a component content of the target object; a control unit that controls the variable wavelength light unit, the image acquiring unit, and the image analyzing unit to allow light having a wavelength corresponding to a component of the target object to be detected to be output through the variable wavelength light unit, adjusts image acquisition timing of the target object in the image acquiring unit, receives data acquired by analyzing the image information of the target object from the image analyzing unit, and determines whether to exist a component included in the target object and a content thereof, a storage unit that stores data which is required by the variable wavelength light unit, the image analyzing unit, and the control unit; and an input and output unit that receives a component to be analyzed with respect to the target object from a user and outputs an analysis result of the received component to the user. The variable wavelength light unit comprises at least one light source and a wavelength changing unit that is spaced from the light source by a predetermined distance and comprises a quantum dot for emitting light corresponding to a predetermined wavelength under a control of the control unit.

According to another aspect of the present disclosure, an image-based component measurement method using a light unit that outputs a variable wavelength comprises selecting a component of a target object to be measured; checking a wavelength band corresponding to the selected component;

changing a wavelength of the light unit to a checked wavelength band; acquiring an image of the target object; processing and analyzing the acquired image; estimating content of the selected component according to an analysis result; and outputting component content results. In the adjusting of the wavelength of the light unit, an irradiation region of a wavelength changing unit including a quantum dot for emitting light corresponding to a predetermined wavelength is adjusted such that light having a selected wavelength is output.

According to another aspect of the present disclosure, a plant cultivation method using an image-based component measurement system comprises selecting a target component of a plant; checking a wavelength band corresponding to the selected component; changing a wavelength of a light emitting device having a variable wavelength to the checked wavelength band; acquiring an image of the plant; processing the acquired image; estimating content of the target component of the plant by analyzing the processed data; outputting component content results; determining whether or not the target component which is contained in the plant reaches a predetermined target value; adjusting a cultivation environment condition if the target component which is contained in the plant does not reach the predetermined target value; and reflecting component measurement results and the adjustment of the cultivation environment condition into a growth model of a relevant plant. In the adjusting of the wavelength of the light emitting device having the variable wavelength to the checked wavelength band, an irradiation region of a wavelength changing unit including a quantum dot for emitting light corresponding to a predetermined wavelength is adjusted such that light having a selected wavelength is output.

According to an image-based component measurement system and a method thereof using a light unit that outputs a variable wavelength according to an embodiment of the present disclosure, it is possible to measure content of a component included in a target object by using a low-cost and small-sized device.

Meanwhile, if a configuration component of a plant (crop) is grasped by using a device which can perform a simple and low-cost component analysis through a component analysis measurement, a growth condition may be controlled by controlling a fertilizer component or by grasping a nutrition state, and since the plant is directly picked up without physical and chemical processing, time and cost are reduced and immediate feedback is possible.

That is, even if an accuracy is slightly lower than that of an expensive apparatus, there is an effect that it is possible to immediately know the content result and whether or not the component is contained.

In addition, according to the plant cultivation method using the light unit that outputs the variable wavelength according to one embodiment of the present disclosure, it is possible to grasp the amount of content of the nutrients contained in the plant and to reflect into a growth model when the plant (crop) grows, and there is an effect that crops which are required for patient food, baby food, diet, and the like and have to contain satisfactory nutrients and the like in particular for diabetes, hypertension, cancer, and the like may be cultivated in a health-customized manner therethrough.

DETAILED DESCRIPTION OF THE DISCLOSURE

Figure 1A:
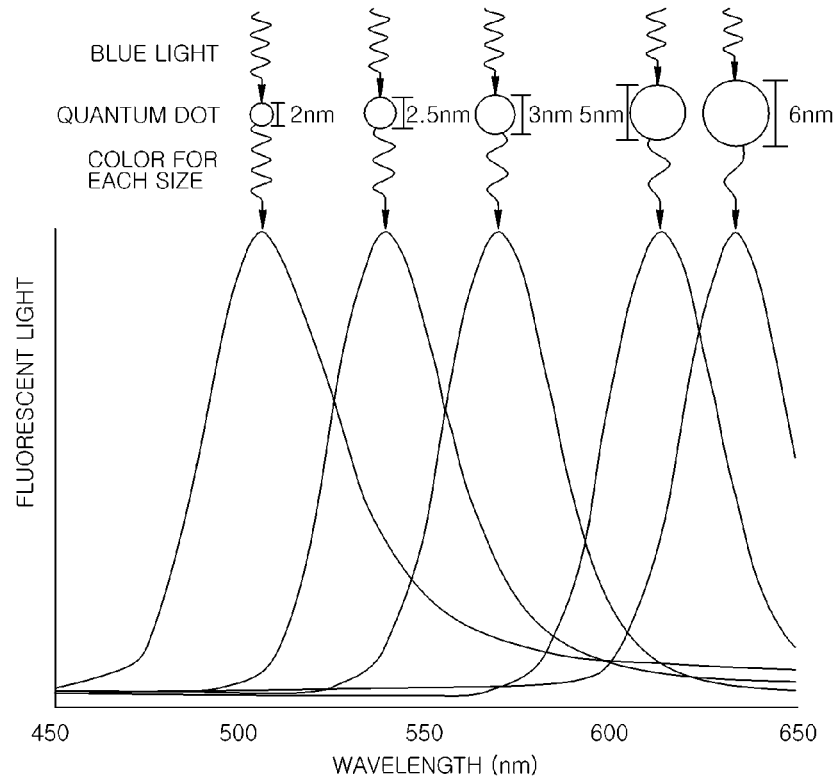
FIGS. 1A and 1B are diagrams illustrating a quantum dot used in the present disclosure.

The present disclosure is susceptible to various modifications and alternative forms, and specific embodiments thereof will be illustrated by way of examples in the drawings and will herein be described in detail.

It should be understood, however, that the present disclosure is not intended to be limited to the particular embodiments but includes all modifications, equivalents, and alternatives falling within the spirit and the scope of the present disclosure.

When an element is referred to as being "connected" or "coupled" to another element, the element may be directly connected or coupled to another element, but it is to be understood that other components may exist therebetween.

Meanwhile, when an element is referred to as being "directly connected" or "directly coupled" to another element, it is to be understood that other elements do not exist therebetween.

The terminology used herein is used for the purpose of describing a particular embodiment only and is not intended to limit the present disclosure.

The singular expression includes plural expressions unless the context clearly describes otherwise.

In the present application, it is to be understood that the term "include", "have" or the like is intended to specify existence of the feature, number, process, operation, configuration element, component or combination thereof described in the specification and does not exclude the existence or addition possibility of one or more other features, numbers, processes, operations, configuration elements, components, or combinations thereof.

Unless defined otherwise, all terms, which are used herein and include technical or scientific terms, have the same meaning as things commonly understood by those skilled in the art to which the present disclosure belongs.

Terms such as those defined in a commonly used dictionary are to be construed as having a meaning consistent with the meaning in the context of the relevant art and are not to be construed as ideal or overly formal in meaning unless explicitly defined in the present application.

Hereinafter, the present disclosure will be described in more detail with reference to the accompanying drawings.

Prior to this, terms and words used in the present specification and claims should not be construed as limited to ordinary or dictionary terms and should be construed in light of meaning and concepts consistent with the technical idea of the present disclosure, based on the principle that the inventor can properly define concept of the term in order to describe the disclosure in the best possible way.

In addition, unless otherwise defined, the technical terms and scientific terms used herein have the meanings as commonly understood by those skilled in the art to which the present disclosure belongs, and description on the known function and configuration that may unnecessarily blur the gist of the present disclosure in the following description and the accompanying drawings will be omitted.

The following drawings are provided by way of examples such that those skilled in the art can fully understand the spirit of the present disclosure.

Therefore, the present disclosure is not limited to the following drawings and may be embodied in other forms.

In addition, the same reference numerals designate the same configuration elements throughout the specification.

It is to be noted that the same configuration elements in the drawings are denoted by the same reference numerals wherever possible.

Figure 1B:
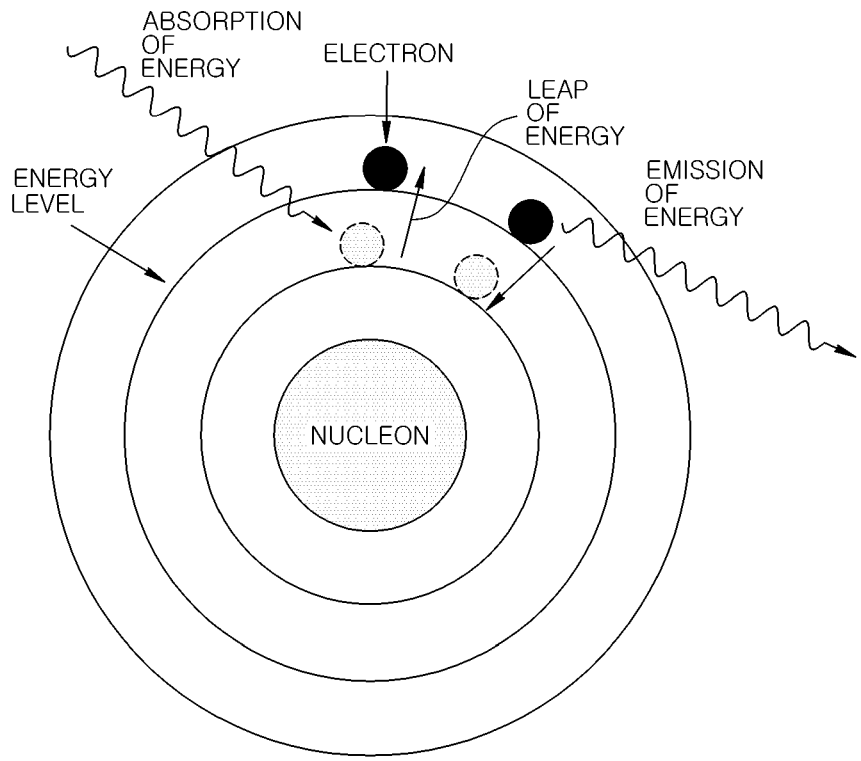

FIGS. 1A and 1B are diagrams illustrating a quantum dot used in the present disclosure.

A quantum dot is a semiconductor crystal in which quanta have been synthesized to a nanometer (nm) scale. When ultraviolet rays (blue light) are applied, the quantum dots exhibit various colors depending on the sizes of the particles even when the particles are of the same component, and such a property is better exhibited in semiconductor materials than in regular materials. Elements such as cadmium, cadmium sulfide, cadmium selenide, and indium phosphide, which have a strong tendency to exhibit the above-mentioned property, are utilized in quantum dot semiconductor crystals. A recent implementation includes a zinc-selenium-sulfur alloy (ZnSeS) enveloped around an indium phosphide core to avoid the use of the heavy metal cadmium.

As illustrated in FIG. 1A, if the quantum dot is small, the quantum dot emits a visible light having a short wavelength such as green, and as the size increases, the quantum dot emits the visible light having a longer wavelength such as red. In general, the bandgap energy is controlled according to the size of the quantum dot, owing to the quantum confinement effect, and thereby, energy of various wavelengths is emitted. That is, the quantum dot emits light as the energy level of the electrons is lowered within the quantum dot, and the larger the quantum dot is, the narrower the gap between energy levels is, whereby a red color corresponding to a longer wavelength and a relatively low energy is emitted. (Source of FIG. 1A: http://informationdisplay.org)

Referring to FIG. 1B, a principle of the quantum dot is that, in a material with clusters of quanta, particularly in semiconductor material, an application of energy from ultraviolet rays or the like causes the electrons within the material to move to a higher energy level by way of a quantum jump and then emit energy to go back down to a lower energy level, the above process being repeated continuously. Here, energy of various wavelengths is emitted depending on the size of the quantum dot. If the wavelength (energy) is within the visible region (380 nm to 800 nm), then various colors visible to the eye are emitted as wavelengths of energy forms.

That is, if the quantum dot absorbs light from an excitation source and reaches an energy-excited state, the quantum dot emits energy corresponding to an energy band gap of the quantum dot. Therefore, by controlling the size or material composition of the quantum dot, it is possible to control the energy band gap, and thereby, light can be emitted in any of the regions from the ultraviolet region to the infrared region.

The quantum dot may be produced by a vapor deposition method such as a metal organic chemical vapor deposition (MOCVD) method or a molecular beam epitaxy (MBE) method, or may be produced by a chemical wet synthesis method. Since the quantum dots produced by the chemical wet synthesis method are dispersed in a solvent in a colloidal state, the quantum dots are separated from the solvent through centrifugation, and the separated quantum dots can be dispersed in a prepared metal-organic precursor solution. Here, the quantum dots can be stabilized by bonding with an organic matter of the metal-organic precursor.

Figure 2:
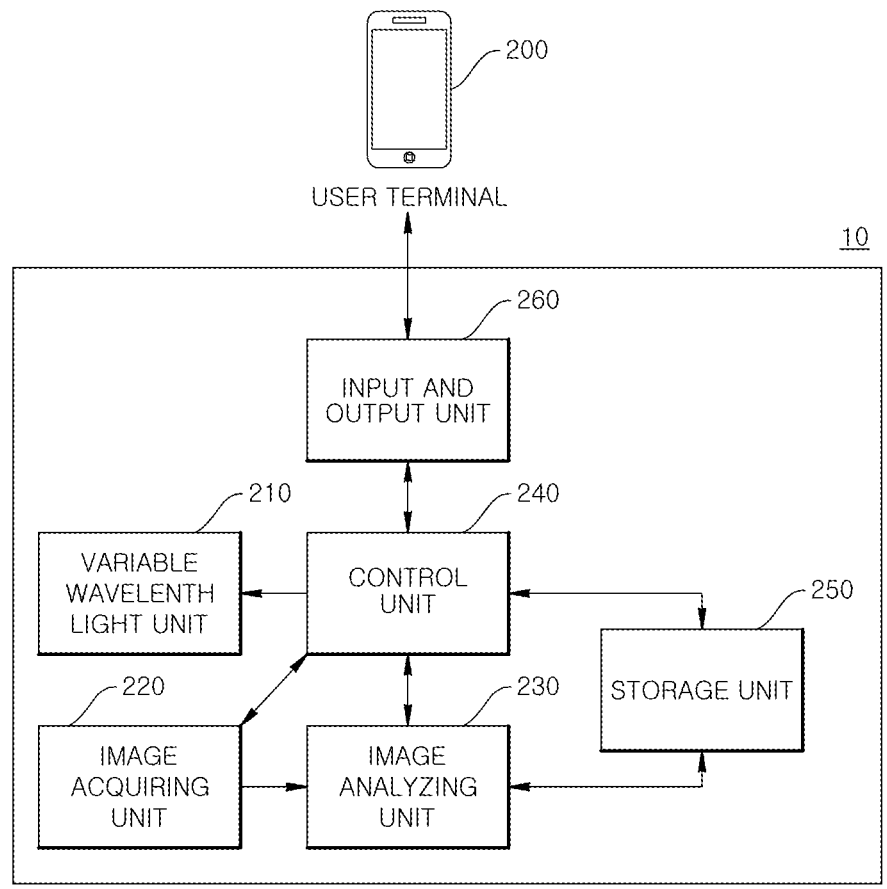
FIG. 2 is a configuration diagram of an example embodiment of an image-based component measurement system which uses a light unit that outputs a variable wavelength according to the present disclosure.

FIG. 2 is a configuration diagram illustrating an example embodiment of an image-based component measurement system 10 using a light unit that outputs a variable wavelength according to the present disclosure.

As illustrated in FIG. 2, the image-based component measurement system using the light unit that outputs the variable wavelength according to the present disclosure includes a variable wavelength light unit 210, an image acquiring unit 220, an image analyzing unit 230, a control unit 240, a storage unit 250, and an input and output unit 260.

The variable wavelength light unit 210 outputs light having a wavelength necessary for analyzing components of a target object.

The image acquiring unit 220 acquires image information of the target object.

For example, the image acquiring unit 220 includes an image capturing device such as a camera.

The image analyzing unit 230 processes an image acquired by the image acquiring unit 220 to analyze an absorption wavelength and a reflection wavelength of the target object.

The control unit 240 controls each of the variable wavelength light unit 210, the image acquiring unit 220, and the image analyzing unit 230, outputs light having a wavelength corresponding to a component to be detected of the target object through the variable wavelength light unit 210, controls image acquisition timing of the target object in the image acquiring unit 220, and receives data in which the image information of the target object is analyzed from the image analyzing unit 230 to determine existence and content of the component which is included in the target object and is intended to be analyzed.

The storage unit 250 stores data required by the variable wavelength light unit 210, the image analyzing unit 230, and the control unit 240.

That is, the storage unit 250 stores data necessary for the image-based component measurement system 10.

Meanwhile, FIG. 2 illustrates that the data is stored in the storage unit 250 included in the image-based component measurement system 10, but the storage unit may also be implemented in a database system or cloud which is provided separately via wired or wireless communication.

The input and output unit 260 receives a component to be analyzed with respect to the target object from a user and outputs an analysis result of the input component to the user.

FIG. 2 illustrates that the data is input and output via a separately provided user terminal 200, but it is also possible for the data to be input and output via input and output means provided in the image-based component measurement system 10.

If the target object is irradiated with light having a wavelength changed according to a component to be analyzed from the variable wavelength light unit 210 under the control of the control unit 240, the image analyzing unit 230 can measure a reflection value, a fluorescence value, and the like from the image information (image) transmitted from the image acquiring unit 220 and grasp the component included in the target object.

In a case of a plant, existence and content of nutrients N, P, K, Ca, Mg, Fe, Zn, and the like for the plant growth can be grasped and specific quality components included in the plant, which are anthocyanin, ascorbic acid, carotenoid, lutein, and the like, can be grasped and utilized for a growth control.

For example, it is possible to measure the content of the anthocyanin by applying light having wavelengths of 550 nm and 700 nm and measuring reflection values.

In addition, it is possible to measure contents of N, P, K, Ca, Mg, Fe, Mn, Zn, and Cu by measuring reflection values of light having wavelengths of 400 to 1100 nm.

Figure 3:
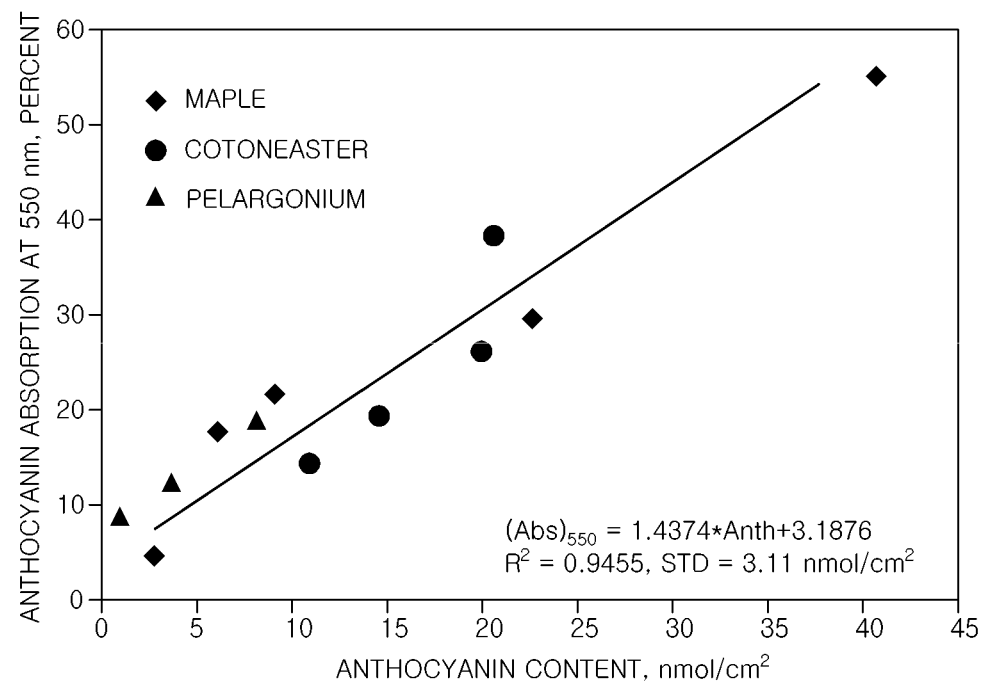
FIG. 3 is an example graph illustrating a correlation between absorption values or reflection values of wavelengths which can be acquired from image information used in the present disclosure and a concentration (content) of actual components.

FIG. 3 is a graph illustrating a correlation between absorption values or reflection values of wavelengths acquired from the image information used in the present disclosure and a concentration (content) of actual components.

In FIG. 3, the absorption value or the reflection value of a specific wavelength acquired from the image information of the plant is illustrated on the y-axis, and component information acquired by processing the plant and extracting the anthocyanin component is illustrated on the x-axis.

The closer the R value is to 1, the stronger the correlation is, and the graph illustrates that the R value is as high as 0.9455.

Through the above-described experiment, a correlation equation between the absorption value or the reflection value of the wavelength acquired from the image information and the content of the actual component can be derived, and the storage unit 250 stores the correlation equation and the data stored in a history, and a configuration component can be measured from absorption values and reflection values of the specific wavelength acquired through image processing under the control of the control unit 240.

Figure 4A:
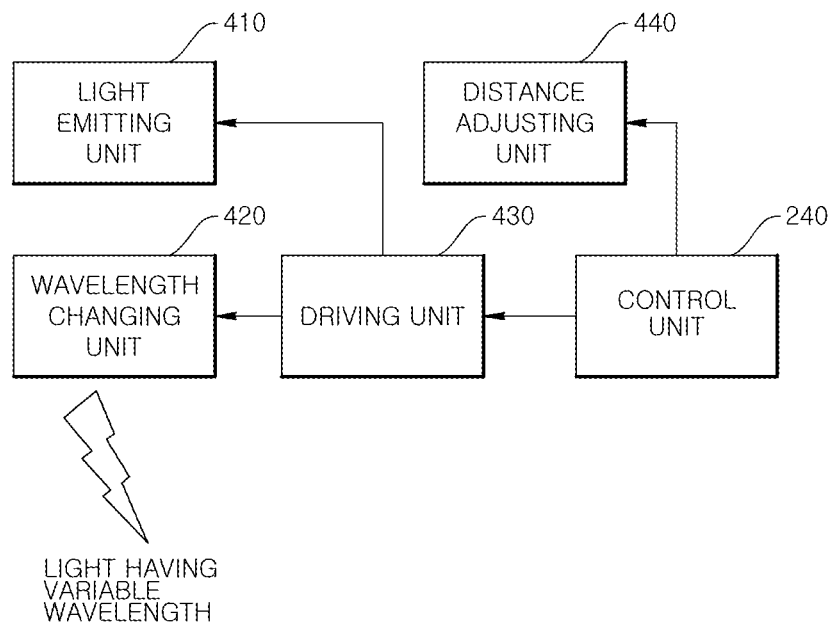
FIG. 4A is a configuration diagram illustrating an example embodiment of the light unit of FIG. 2.

FIG. 4A is a configuration diagram illustrating an example embodiment of the variable wavelength light unit of FIG. 2 according to the present disclosure.

As illustrated in FIG. 4A, the variable wavelength light unit using quantum dots comprises a light emitting unit 410, a wavelength changing unit 420, a driving unit 430, and a control unit 240.

The light emitting unit 410 comprises at least one light source, and, for example, a plurality of light sources may be arranged in a matrix form. The light source comprises an LED emitting white or blue light.

The wavelength changing unit 420 is spaced apart from the light emitting unit 410 by a predetermined distance and comprises quantum dots that emit light corresponding to a predetermined wavelength in each of a plurality of separated regions of the wavelength changing unit 420, which in turn correspond to each of the light sources or correspond to each column or each row of the light sources.

The driving unit 430 is configured to adjust a position of the light source or the wavelength changing unit 420 so as to change a region of the wavelength changing unit 420 irradiated by the light source, and one or more driving units can be provided.

The control unit 240 controls an operation of the driving unit 430 to change a wavelength outputted from the variable wavelength light unit using quantum dots.

Specifically, the control unit 240 is configured to change the position of the wavelength changing unit 420 or the light emitting unit 410 in consideration of information regarding the wavelengths and mixed proportion of wavelengths that vary according to the growth phase of the plants and information regarding the wavelengths outputted as a result of the position control of the wavelength changing unit 420 or light emitting unit 410, thus changing the wavelengths outputted from the light emitting device.

That is, the variable wavelength light unit using quantum dots emits light having wavelengths that may be varied by a combination of multiple wavelengths.

The variable wavelength light unit using quantum dots may further comprise a distance adjusting unit 450. The distance adjusting unit 450 adjusts the distance between the light emitting unit 410 and the wavelength changing unit 420 according to the control of the control unit 240.

Hereinafter, an embodiment of the variable wavelength light unit used in the present disclosure will be described with reference to FIGS. 4B, 4C, 5, and 6.

Figure 4B:
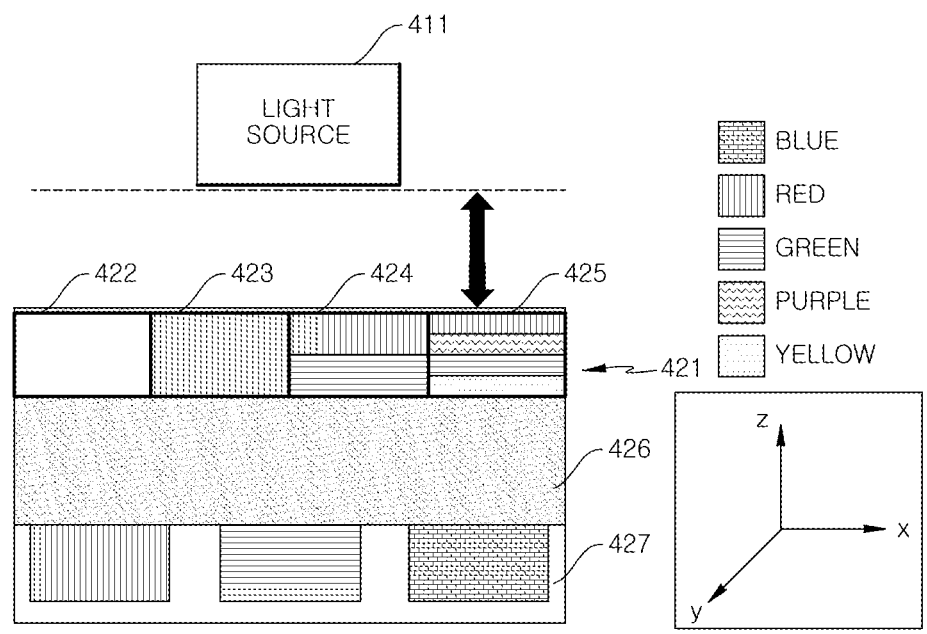
FIG. 4B is a diagram illustrating a first example embodiment of the light unit that outputs the variable wavelength according to one embodiment used for the present disclosure.
Figure 4C:
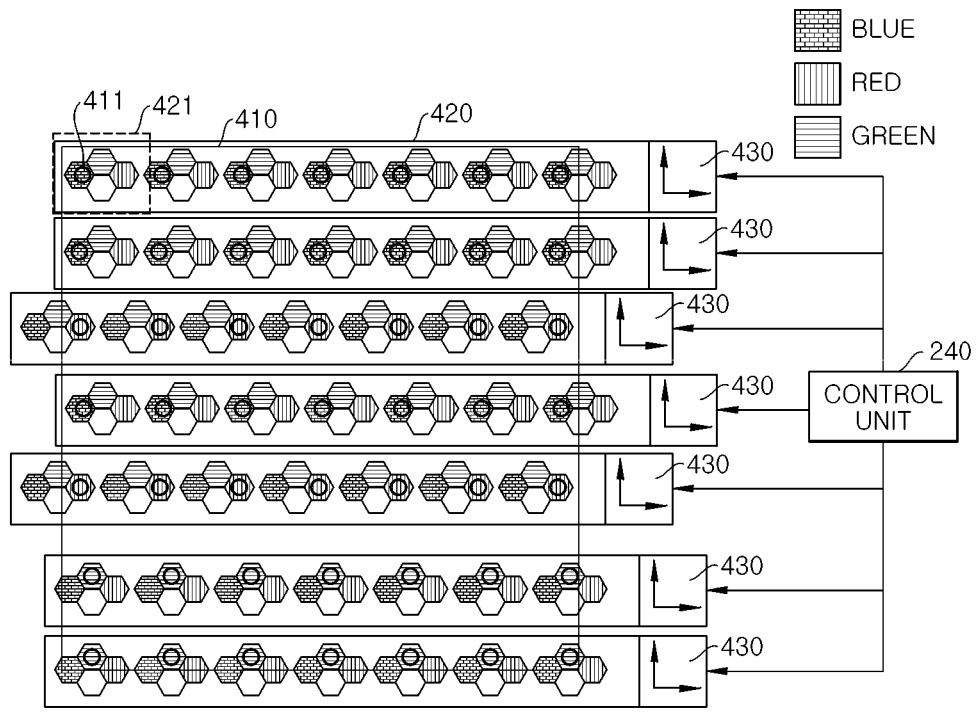
FIG. 4C is a detailed configuration diagram of a wavelength changing unit 421 illustrated in FIG. 4B.

FIG. 4B is a diagram illustrating a first embodiment of a light unit that outputs a variable wavelength according to one embodiment used for the present disclosure, and FIG. 4C is a detailed configuration diagram of the wavelength changing unit 421 illustrated in FIG. 4B.

As illustrated in FIG. 4B, the wavelength changing unit 421 comprises a first region 422 which allows the wavelength of the light source 411 to be outputted as it is, a second region 423 including quantum dots for emitting a red color, a third region 424 in which quantum dots for emitting a red color and quantum dots for emitting a green color are stacked, and a fourth region 425 in which quantum dots for emitting a red color, quantum dots for emitting a violet color, quantum dots for emitting a green color, and quantum dots for emitting a yellow color are stacked.

Although the figure illustrates only the region including quantum dots for emitting a red color, regions including quantum dots for emitting a green color and a blue color (not illustrated) can also be included.

The wavelength changing unit 421 may comprise a region including quantum dots (not illustrated) in which two or more types of quantum dots for red, green, and blue colors are mixed together to emit a new arbitrary color (for example, yellow, violet, or the like).

In the fourth region 425 in which a plurality of layers formed with the quantum dots are stacked together, the quantum dots that absorb and emit longer wavelengths may be stacked closer to the light source 411, or the quantum dots that absorb and emit longer wavelengths may be stacked further away from the light source 411.

The wavelength changing unit 421 may further comprise an optical film 426 for protecting the plurality of separated regions 422 to 425 and a color filter 427 for increasing the color purity of light passing through the plurality of separated regions 422 to 425.

The driving unit 430 may adjust the position of the wavelength changing unit 420 or the light emitting unit 410 in the x and y directions such that a region of the wavelength changing unit 420 irradiated by the light source is changed, and a distance adjusting unit (not illustrated) for adjusting the distance between the light source 411 and the wavelength changing unit 421 may adjust the position in the z direction.

As illustrated in FIG. 4C, the first embodiment of the plant growth light emitting device for providing variable wavelengths using quantum dots comprises a light emitting unit 410, a wavelength changing unit 420, a driving unit 430, and a control unit 240.

The light emitting unit 410 comprises at least one light source 411, and as an example, a plurality of light sources are arranged in the form of a 7×7 matrix.

The wavelength changing unit 420 is spaced apart from the light emitting unit 410 by a predetermined distance and is illustrated as four hexagons corresponding to each light source 411, and each hexagonal region comprises quantum dots for emitting light corresponding to a predetermined wavelength.

The driving unit 430 is configured to adjust a position of the wavelength changing unit 420 in the x and y directions on a row-by-row basis such that a region of the wavelength changing unit 420 irradiated by the light source is changed, and one or more driving units may be provided.

The control unit 240 is configured to control the operation of each of the one or more driving units 430 to change the wavelength outputted from the plant growth light emitting device for providing variable wavelengths using quantum dots.

While FIG. 4a illustrates an example where the driving unit 430 controls the wavelength changing unit 420 on a row-by-row basis to change the irradiated region, it is possible to control the wavelength changing unit 420 on a column-by-column basis, and it is also possible to control the position of the light emitting unit 410 on a row-by-row basis or column-by-column basis to change the irradiated region.

Figure 5:
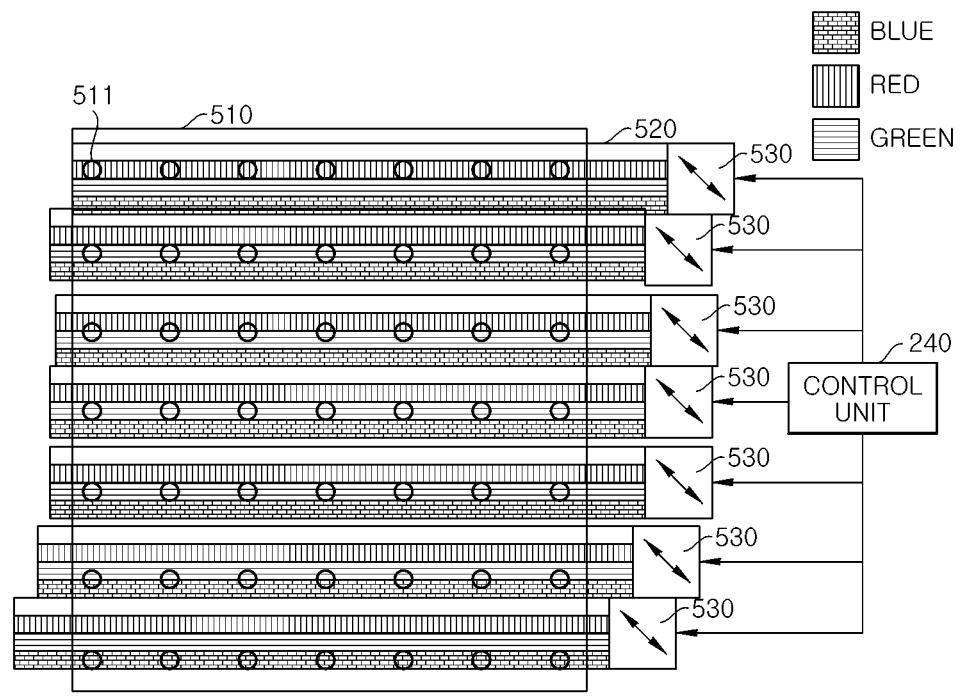
FIG. 5 is a diagram illustrating a second example embodiment of the light unit that outputs the variable wavelength according to the embodiment used in the present disclosure.

FIG. 5 is a diagram illustrating a second embodiment of a light emitting device for growing plants having variable wavelengths using quantum dots according to an embodiment of the present disclosure.

As illustrated in FIG. 5, the second embodiment of the plant growth light emitting device for providing variable wavelengths using quantum dots comprises light emitting unit 510, a wavelength changing unit 520, a driving unit 530 and a control unit 240.

The light emitting unit 510 comprises at least one light source 511, and for example, a plurality of light sources are arranged in the form of a 7×7 matrix.

The wavelength changing unit 520 is spaced apart from the light emitting unit 510 by a predetermined distance and is illustrated in a four-line form corresponding respectively to each row of the light source 511, with each region of line comprising quantum dots for emitting light corresponding to a predetermined wavelength.

The driving unit 530 is configured to control a position of the wavelength changing unit 520 in a diagonal direction on a row-by-row basis to change the region of the wavelength changing unit 520 irradiated by the light emitting unit 510, and one or more the driving units may be provided.

The control unit 240 controls the operation of each of the one or more driving units 530 to change the wavelengths outputted from the plant growth light emitting device for providing variable wavelengths using quantum dots.

While FIG. 5 illustrates the driving unit 530 as controlling the wavelength changing unit 520 on a row-by-row basis to change the irradiation regions, it is also possible to control the position of the wavelength changing unit 520 on a column-by-column basis, and it is also possible for the driving unit 530 to control the position of the light emitting unit 510 on a row-by-row basis or a column-by-column basis to change the irradiated regions.

Figure 6:
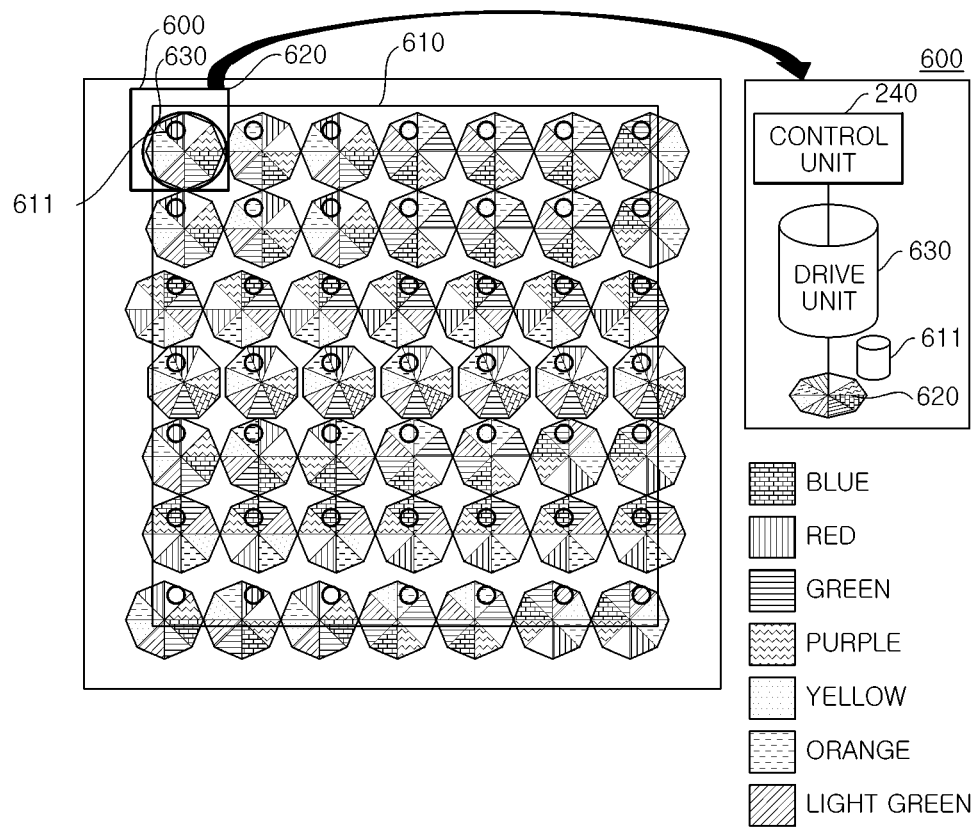
FIG. 6 is a diagram illustrating a third example embodiment of the light unit that outputs the variable wavelength according to the embodiment used in the present disclosure.

FIG. 6 is a diagram illustrating a third embodiment of a light emitting device for growing plants having variable wavelengths using quantum dots according to an embodiment of the present disclosure.

As illustrated in FIG. 6, the third embodiment of a light emitting device for growing plants having variable wavelengths using quantum dots comprises a light emitting unit 610, a wavelength changing unit 620, a driving unit 630 and a control unit 240.

The light emitting unit 610 comprises at least one light source 611. As an example, a plurality of light sources may be arranged in the form of a 7×7 matrix.

The wavelength changing unit 620 is spaced apart from the light emitting unit 610 by a predetermined distance and is illustrated as an octagon divided into eight regions corresponding to the light sources 611 respectively, with each region having quantum dots that emit light corresponding to a predetermined wavelength. Here, the shape of each light source 611 may be circular.

That is, each wavelength changing unit 620 corresponding to a respective light source 611 has eight triangular shapes arranged about a central point, and each region includes quantum dots for emitting light corresponding to the predetermined wavelength.

The driving unit 630 is configured to rotate the wavelength changing unit 620 to change the region of the wavelength changing unit 620 irradiated by the light source 611, and the driving units 620 are provided in the same number as the wavelength changing units 620.

The control unit 240 controls the operation of each of the driving units 630 to change the wavelengths outputted from the plant growth light emitting device for providing variable wavelengths using quantum dots.

While FIG. 6 illustrates an example where the driving unit 630 changes the irradiation region by rotating the wavelength changing unit 620, it is also possible for the driving unit 630 to control the position of the light source 611 to change the irradiation region.

For example, the driving unit 630 may be configured to rotate through the attraction and repulsion obtained using an electromagnet, of which the polarity may be changed according to the flow of current, and can be designed such that the wavelength changing unit 620 or the light source 611 can be rotationally moved by way of the rotating driving unit 630.

A method of changing the irradiation region by rotating the wavelength changing unit 620 by means of the driving unit 630 rotating under the control of the control unit 240 may be understood by referring to the configuration diagram of a portion 600 of the plant growth light emitting device for providing variable wavelengths using quantum dots.

The rotating driving unit 630 may be designed to move the rotated member in the z-axis direction. Therefore, the rotating driving unit 630 may also be used as a distance adjusting unit for adjusting the distance between the light source 611 and the wavelength changing unit 620.

Figure 7:
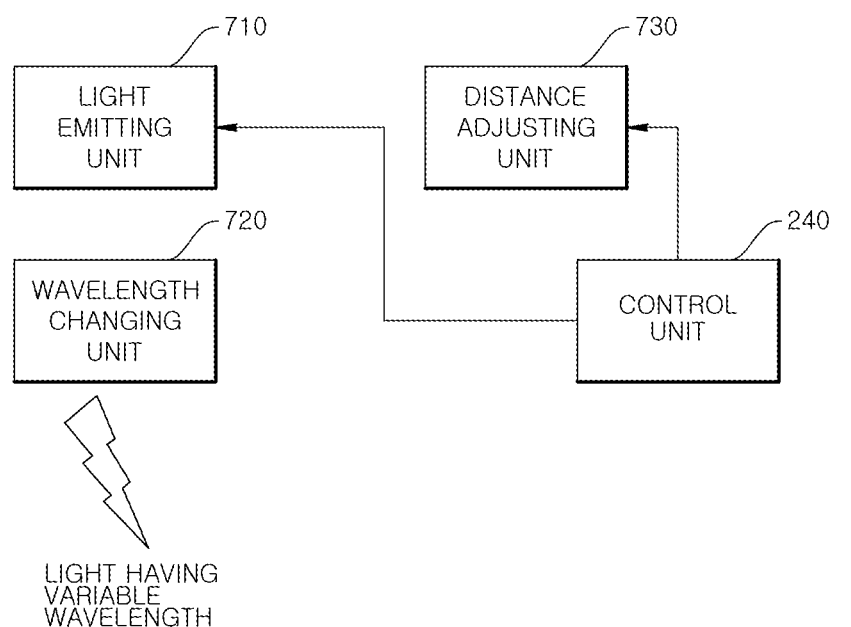
FIG. 7 is a configuration diagram illustrating another embodiment of the light unit of FIG. 2.

FIG. 7 is a diagram illustrating a light emitting device for growing plants having variable wavelengths using quantum dots according to another embodiment of the present disclosure.

As illustrated in FIG. 7, the plant growth light emitting device for providing variable wavelengths using quantum dots comprises a light emitting unit 710, a wavelength changing unit 720, and a control unit 240.

The light emitting unit 710 may comprise at least one light source, and a plurality of light sources may be arranged in the form of a matrix.

The wavelength changing unit 720 is spaced apart from the light emitting unit 710 by a predetermined distance and includes quantum dots that emit light corresponding to a predetermined wavelength in each of a plurality of separated regions, which in turn correspond to each of, each column of, or each row of light sources.

The control unit 240 controls the operation of the light emitting unit 710 to change the wavelengths outputted from the plant growth light emitting device for providing variable wavelengths using quantum dots.

Specifically, the control unit 240 controls the on/off state or the activation time (turn-on time) of each light source of the light emitting unit 710 according to the growth phase, in consideration of information regarding the different wavelengths and mixed proportions of wavelengths needed for different growth phases of the plants and information regarding the outputted wavelengths obtained for different positions of the light emitting unit 710, thereby controlling the wavelength outputted from the light emitting device. It is also possible to control the intensity of the corresponding wavelength by adjusting the light intensity of each light source. The on/off state of the light source may be adjusted by a pulse width modulation (PWM) signal for controlling the light source, and the light intensity of the light source may be controlled by, for example, a dimmer which is a light adjustment device.

That is, the plant growth light emitting device for providing variable wavelengths using quantum dots outputs light with the wavelength varied by combining multiple wavelengths.

The plant growth light emitting device for providing variable wavelengths further comprises a distance adjusting unit 750. The distance adjusting unit 750 adjusts the distance between the light emitting unit 710 and the wavelength changing unit 720 according to the control of the control unit 240.

Below, embodiments of a plant growth light emitting device for providing variable wavelengths using quantum dots according to another embodiment of the present disclosure will be described with reference to FIGS. 8 and 9.

Figure 8:
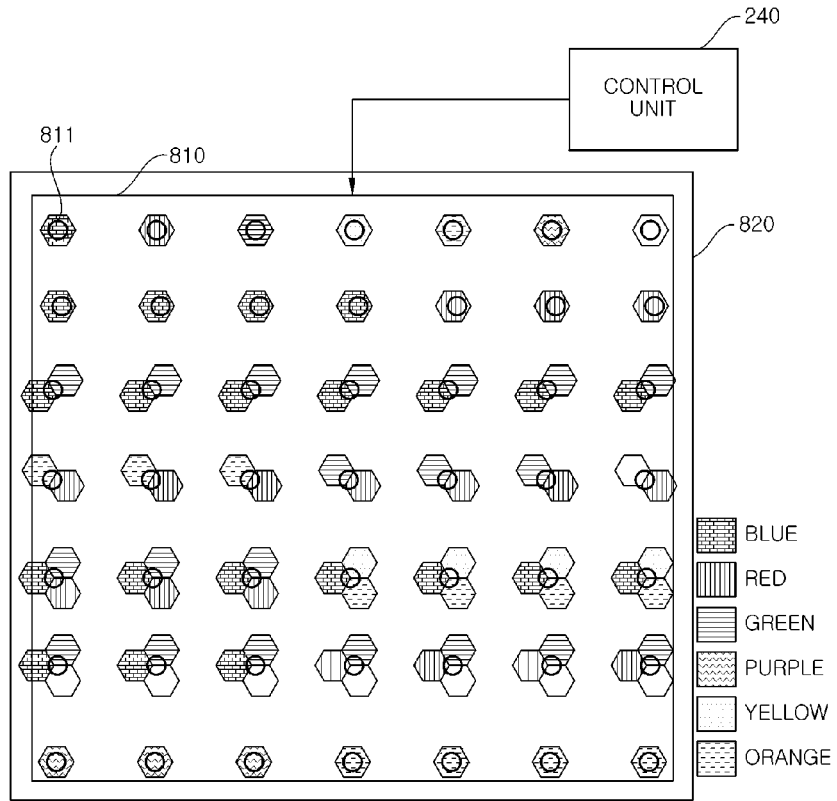
FIG. 8 is a diagram illustrating a first example embodiment of a light unit that outputs a variable wavelength according to another embodiment of the present disclosure.

FIG. 8 is a diagram illustrating a first embodiment of a light emitting device for growing plants having a variable wavelength using quantum dots according to another embodiment of the present disclosure.

As illustrated in FIG. 8, the first example implementation of the plant growth light emitting device for providing variable wavelengths using quantum dots comprises light emitting unit 810, a wavelength changing unit 820 and a control unit 240.

The light emitting unit 810 comprises at least one light source 811, and, for example, a plurality of light sources are arranged in the form of a 7×7 matrix.

The wavelength changing unit 820 is spaced apart from the light emitting unit 810 by a predetermined distance and is illustrated as including at least one or more hexagonal regions corresponding to the light sources 811, respectively, with each hexagonal region including quantum dots for emitting light corresponding to a predetermined wavelength. The quantum dot region may have another shape such as a triangle, a square, and a circle as well as the hexagon.

Specifically, each light source 811 may correspond to a region that includes quantum dots for emitting colors having different wavelengths and may also correspond to a region in which at least two or more types of quantum dots for emitting different colors are combined together.

The wavelength changing unit 820 may further comprise an optical film (not illustrated) for protecting the plurality of separated regions and a color filter (not illustrated) for increasing the color purity of the light passing through the plurality of separated regions.

The control unit 240 controls the operation of each of the light sources 811 to change the wavelength outputted from the plant growth light emitting device for providing variable wavelengths using quantum dots.

Specifically, the control unit 240 controls the on/off state or the activation time (turn-on time) of each light source of the light emitting unit 810 according to the growth phase, in consideration of information regarding the different wavelengths and mixed proportions of wavelengths needed for different growth phases of the plants and information regarding the outputted wavelengths obtained for different positions of the light emitting unit 810, thereby controlling the wavelength outputted from the light emitting device. It is also possible to control the intensity of the corresponding wavelength by adjusting the light intensity of each light source.

Figure 9:
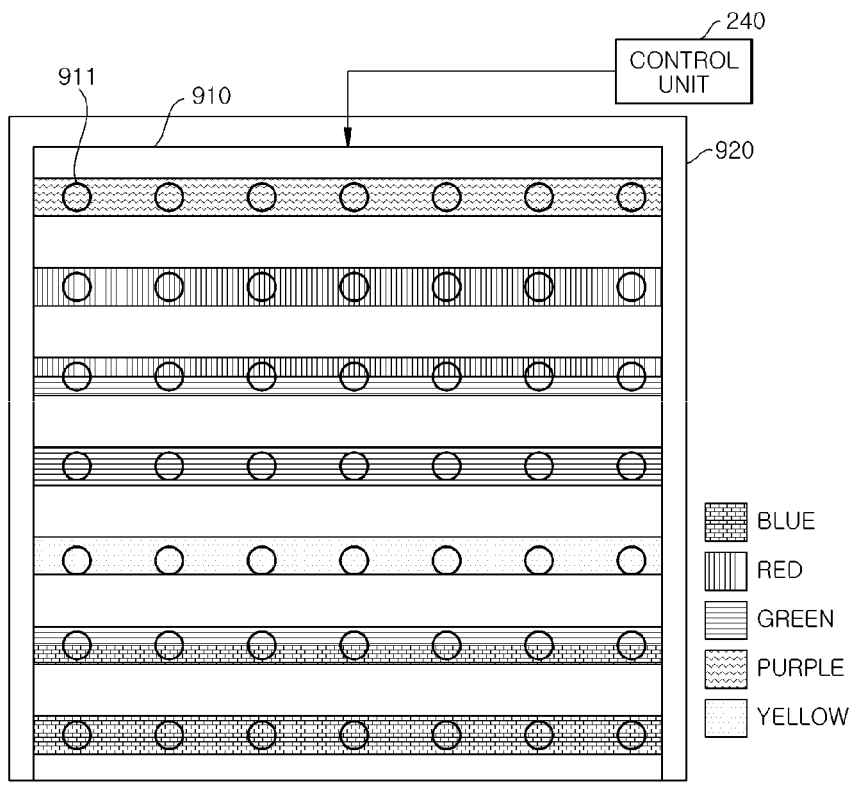
FIG. 9 is a diagram illustrating a second example embodiment of the light unit that outputs a variable wavelength according to another embodiment of the present disclosure.

FIG. 9 is a diagram illustrating a second embodiment of a light emitting device for growing plants having a variable wavelength using quantum dots according to another embodiment of the present disclosure.

As illustrated in FIG. 9, the second example implementation of the plant growth light emitting device for providing variable wavelengths using quantum dots comprises light emitting unit 910, a wavelength changing unit 920 and a control unit 240.

The light emitting unit 910 comprises at least one light source 911, and, for example, a plurality of light sources are arranged in the form of a 7×7 matrix.

The wavelength changing unit 920 is spaced apart from the light emitting unit 910 by a predetermined distance and is illustrated as including at least one or more linearly shaped regions each corresponding to a row of light sources 911, where each linearly shaped region includes quantum dots for emitting light corresponding to a predetermined wavelength.

Specifically, the rows of light sources 911 may correspond, respectively, to regions including quantum dots for emitting colors of different wavelengths or to regions in which at least two or more types of quantum dots emitting different colors are combined.

The wavelength changing unit 920 may further comprise an optical film (not illustrated) for protecting the plurality of separated regions and a color filter (not illustrated) for increasing the color purity of light passing through the plurality of separated regions.

The control unit 240 controls the operation of each row of or each of the light sources 911 to change the wavelength outputted from the plant growth light emitting device for providing variable wavelengths using quantum dots.

Specifically, the control unit 240 controls the on/off state or the activation time (turn-on time) of each light source of the light emitting unit 810 according to the growth phase, in consideration of information regarding the different wavelengths and mixed proportions of wavelengths needed for different growth phases of the plants and information regarding the outputted wavelengths obtained for different positions of the light emitting unit 910, thereby controlling the wavelength outputted from the light emitting device. It is also possible to control the intensity of the corresponding wavelength by adjusting the light intensity of each light source.

While FIG. 9 illustrates a setup in which the wavelength is changed by controlling the operation of each row of light sources 911 or each of the light sources 911, it is also possible to control the operation of each column of light sources 911.

Figure 10:
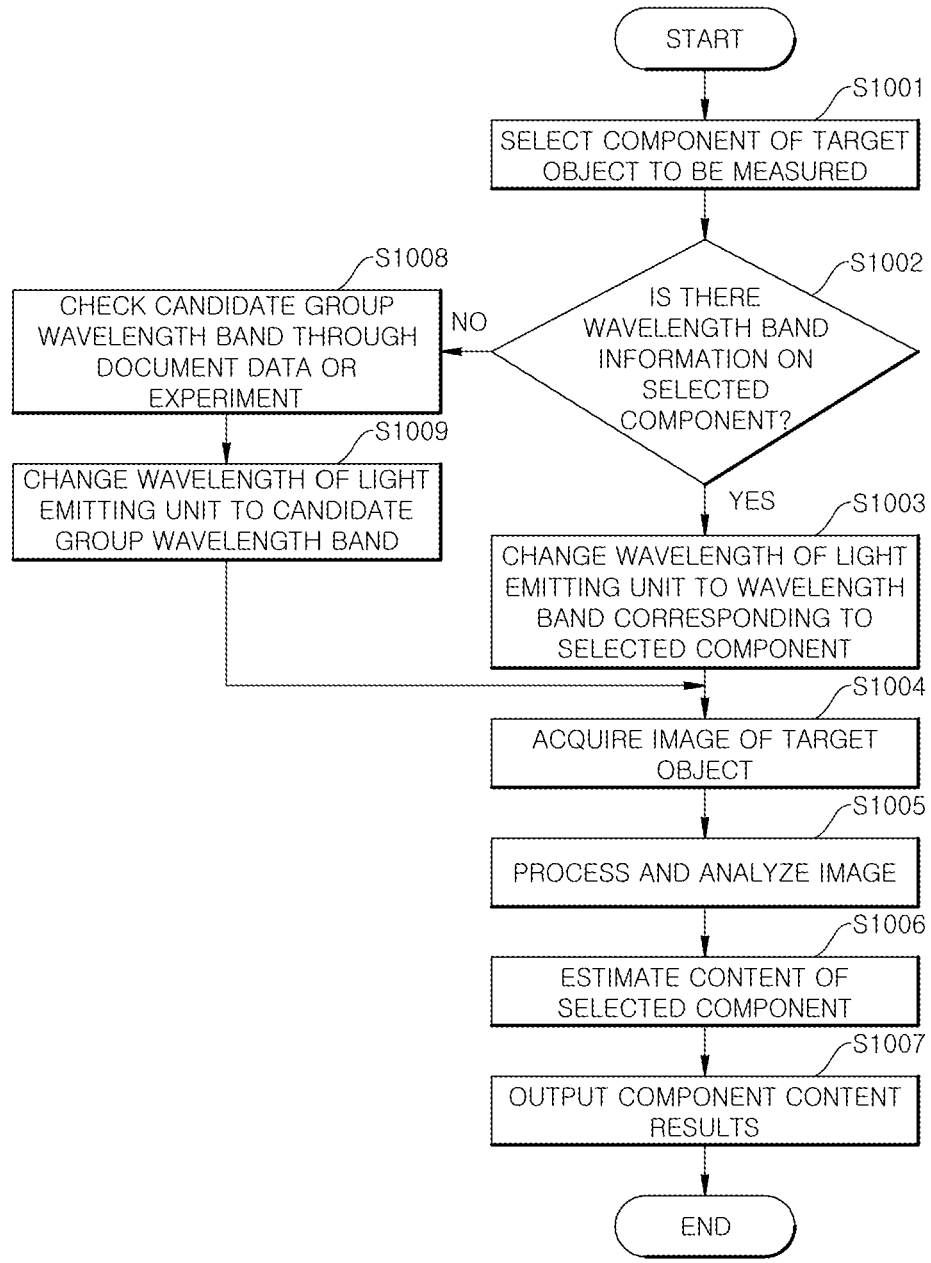
FIG. 10 is a flowchart illustrating an example embodiment of an image-based component measurement method which uses the light unit that outputs the variable wavelength according to the present disclosure.

FIG. 10 is a flowchart illustrating an example embodiment of an image-based component measurement method which uses a light unit that outputs a variable wavelength according to the present disclosure.

First, a component of a target object to be measured is selected (S1001).

Thereafter, whether or not there is wavelength band information on the selected component is determined (S1002).

If it is determined in step S1002 that there is the wavelength band information on the selected component, the wavelength of the light unit is adjusted to a wavelength band corresponding to the selected component (S1003).

Thereafter, an image of a target object is acquired (S1004).

In step S1004 of acquiring the image of the target object, the image of the target object is acquired in a state in which there is light having a wavelength necessary for analyzing a component to be measured, or the image of the target object is acquired in a state in which light disappears after the light is emitted from the variable wavelength light unit 210.

Thereafter, image processing and analysis for the acquired image are performed (S1005).

At this time, only the reflected light to be measured remains and noise is removed through a preprocessing process of each image for each wavelength, and thereby, a reflectance of each measurement point for each wavelength is acquired.

Thereafter, content of the selected component is estimated from a correlation equation between a reflectance value for each measurement point for each wavelength and the reflectance and component stored in a database (S1006).

Thereafter, a result of the component content is output (S1007).

Meanwhile, if it is determined in step S1002 that there is no wavelength band information on the selected component, a candidate group wavelength band is checked through document data or an experiment (S1008).

A method of checking the candidate group wavelength band through the experiment includes a method of measuring images of various wavelengths and comparing the measurement result with a direct component analysis result such as an extraction method.

For example, a data processing technique such as a partial least squares discriminant analysis (PLS-DA) is used.

By using this method, the candidate group wavelength band information on each component is acquired and stored.

The wavelength of the light unit is adjusted to the candidate group wavelength band (S1009), the processing proceeds to step S1004, and next step is performed.

Figure 11:
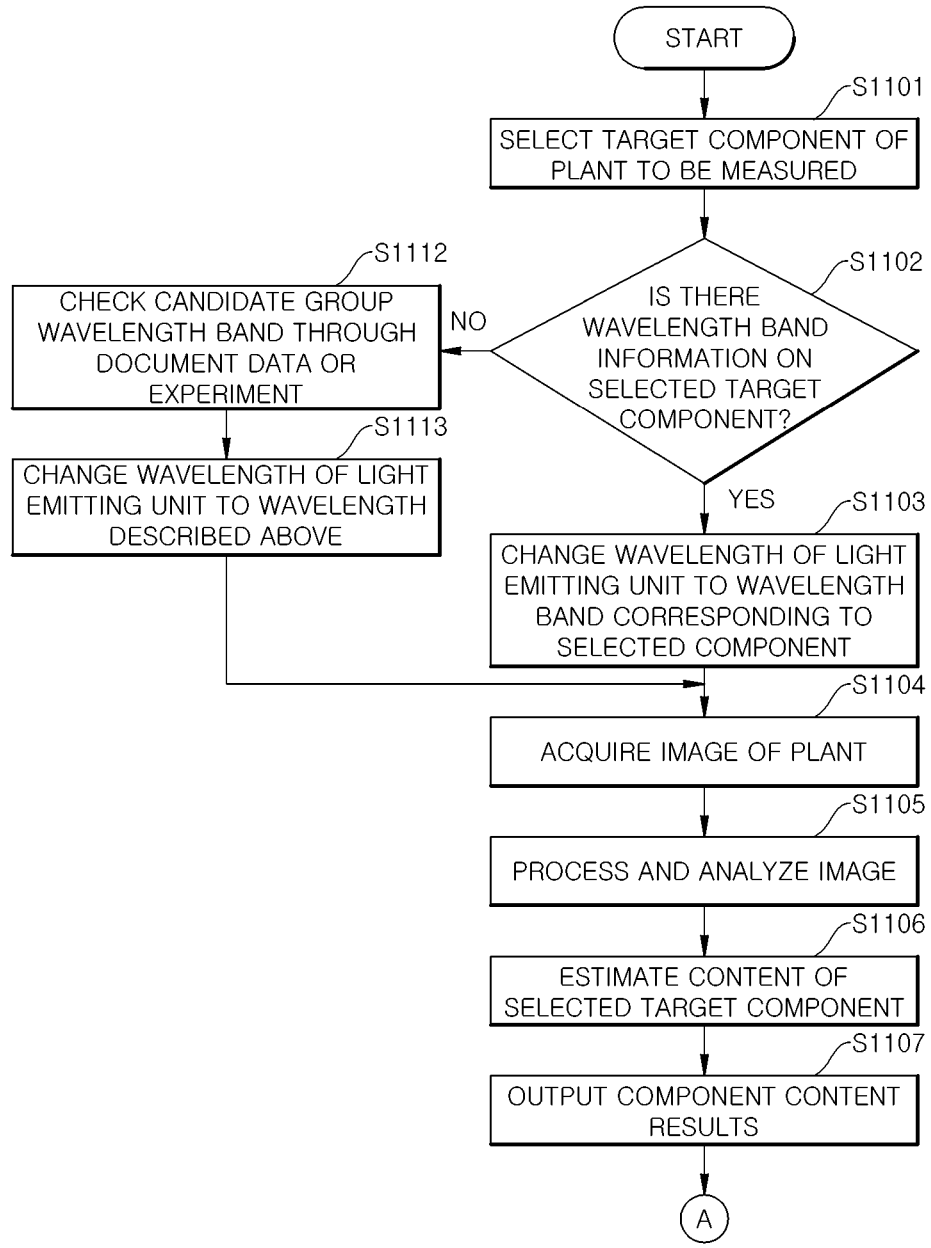
FIG. 11 is a flowchart illustrating an example embodiment of a plant cultivation method which uses the image-based component measurement system according to the present disclosure.
Figure 11:
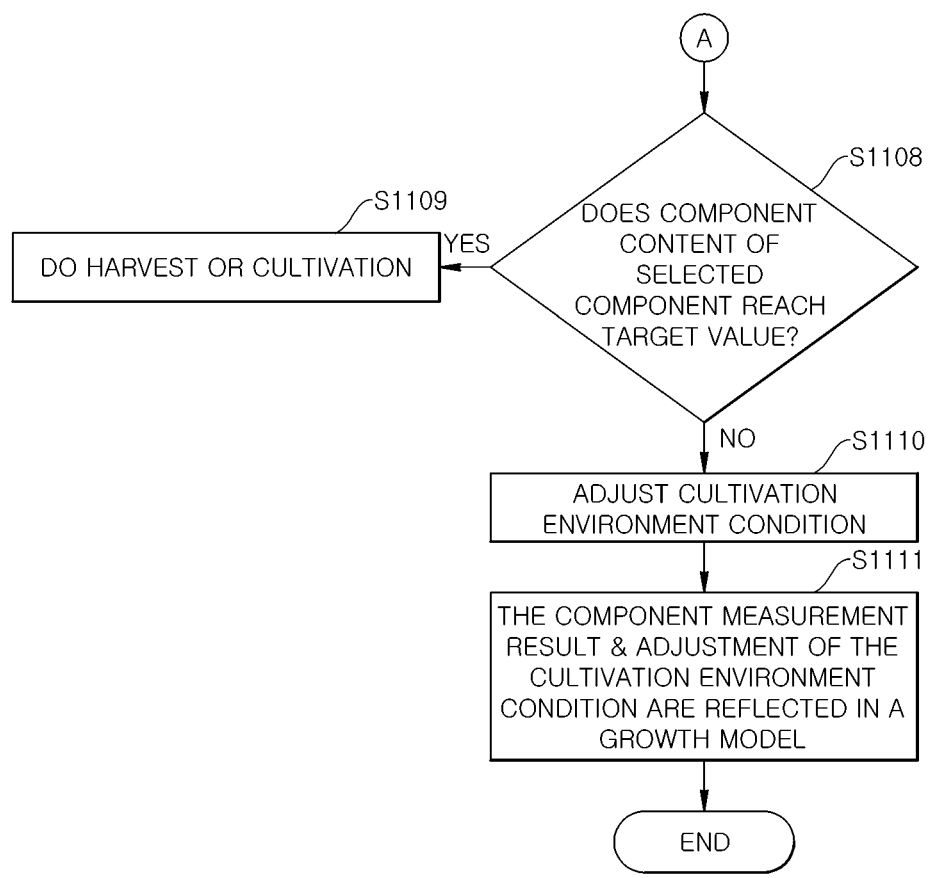

FIG. 11 is a flowchart illustrating an example embodiment of a plant cultivation method which uses an image-based component measurement system according to the present disclosure.

First, a target component of a plant to be measured is selected (S1101).

Thereafter, whether or not there is wavelength band information on the selected component is determined (S1102).

If it is determined in step SI 102 that there is the wavelength band information on the selected target component, the wavelength of the light unit is adjusted to a wavelength band corresponding to the selected component (S1103).

Thereafter, an image of the plant is acquired (S1104).

In step S1104 of acquiring an image of the plant, the image of the plant is acquired in a state in which there is light having a wavelength necessary for analyzing a component to be measured, or the image of the plant is acquired in a state in which light disappears after the light is emitted from the variable wavelength light unit 210.

Thereafter, image processing and analysis for the acquired image are performed (S1105).

At this time, the reflected light to be measured remains and noise is removed through a preprocessing process of each image for each wavelength, and thereby, a reflectance of each measurement point for each wavelength is acquired.

Thereafter, content of the selected component is estimated from a correlation equation between a reflectance value for each measurement point for each wavelength and the reflectance and component stored in a database (S1106).

Thereafter, a result of the component content is output (S1107).

Thereafter, whether or not the content of the selected target component reaches a predetermined target value is determined (S1108).

If the component contained in the plant reaches the predetermined target value, harvest or cultivation is continued (S1109).

Meanwhile, if the component contained in the plant does not reach the predetermined target value, a cultivation environment condition is adjusted (S1110).

Thereafter, the component measurement result and the adjustment of the cultivation environment condition are reflected in a growth model of a relevant plant (S1111).

Meanwhile, if it is determined in step S1102 that there is no wavelength band information on the selected target component, a candidate group wavelength band is checked through document data or an experiment (S1112).

A method of checking the candidate group wavelength band through the experiment includes a method of measuring images of various wavelengths and comparing the measurement result with a direct component analysis result such as an extraction method.

For example, a data processing technique such as a partial least squares discriminant analysis (PLS-DA) is used.

By using the method, the candidate group wavelength band information on each component is acquired and stored.

The wavelength of the light unit is adjusted to the candidate group wavelength band (S1113), the processing proceeds to step S1104, and next step is performed.

Although a plant cultivation method of using an image-based component measurement method and an image-based component measurement system which use a light unit that outputs a variable wavelength according to an embodiment of the present disclosure is described, it is also possible to realize a computer-readable recording medium storing a program for implementing the plant cultivation method of using the image-based component measurement method and the image-based component measurement system which use the light unit that outputs the variable wavelength, and a program stored in the computer-readable recording medium storing the program for implementing the plant cultivation method of using the image-based component measurement method and the image-based component measurement system which use the light unit that outputs the variable wavelength.

That is, it will be readily apparent to those skilled in the art that the plant cultivation method of using the image-based component measurement method and the image-based component measurement system which use the light unit that outputs the variable wavelength may be provided in a state of being included in a recording medium which can be read by a computer by tangibly embodying a program of commands for implementing the plant cultivation method.

In other words, the plant cultivation method may be implemented in the form of a program command that can be executed through various computer means so as to be recorded in a computer-readable recording medium.

The computer-readable recording medium may include a program command, a data file, a data structure, and the like, alone or in combination.

The program commands recorded in the computer-readable recording medium may be specifically designed and configured for the present disclosure or may be known and available to those skilled in the computer software.

An example of the computer-readable medium includes a magnetic medium such as a hard disk, a floppy disk, and a magnetic tape, an optical medium such as a CD-ROM and a DVD, a magneto-optical medium such as a floptical disk, and a hardware device specifically configured to store and execute a program command such as a ROM, a RAM, a flash memory, and a USB memory.

The computer-readable recording medium may be a transmission medium such as light, a metal line or a wave guide including a carrier wave for transmitting a signal that designates a program command, a data structure, and the like.

An example of the program command includes not only a machine language code generated by a compiler, but also a high-level language code that can be executed by a computer using an interpreter or the like.

The hardware device may be configured to operate as one or more software modules to perform operations of the present disclosure and vice versa.

The present disclosure is not limited to the above-described embodiments, and it goes without saying that the scope of application of the present disclosure is various and that the present disclosure may be embodied in various forms without departing from the spirit and scope of the disclosure as defined in the appended claims.

What is claimed is:

1. An image-based component measurement system comprising:
a variable wavelength light emitter that outputs light having a wavelength necessary for analyzing a component of a target object;
in input circuitry that receives a component selected by a user to be measured with respect to the target object;
an image acquiring circuitry that acquires image information of the target object;
an image analyzing circuitry that processes an image acquired by the image acquiring circuitry, and obtains an absorption value and a reflection value of the wavelength of the target object;
a processor that controls the variable wavelength light emitter output light having a wavelength corresponding to the component selected by the user, receives the absorption value and the reflection value of the wavelength of the target object obtained by the image analyzing circuitry, and determines whether to exist the component selected by the user in the target object and a content thereof; and
a storage that stores a correlation between the absorption value or the reflection value of the wavelength and the component content,
wherein the variable length light emitter comprises at least one light source, a wavelength changing film spaced apart from the at least one light source a predetermined distance and comprising a plurality of regions, each of the plurality of regions corresponding to each of, each column of, or each row of the at least one light source, and a driving motor configured to change a region of the wavelength changing film illuminated by the light source, and
wherein the plurality of regions of the wavelength changing film are separated into rows or columns, and the driving motor is configured to move the wavelength changing film in row or column direction to change the region of the wavelength changing film illuminated by the light source.

2. The image-based component measurement system according to claim 1, wherein each region of the wavelength changing film has quantum dots corresponding to a predetermined wavelength, and the wavelength changing film comprises at least one of a first region including a quantum dot for emitting red, a second region including a quantum dot for emitting green, a third region including a quantum dot for emitting blue, a fourth region having at least two quantum dots for emitting red, green, and blue, a fifth having a layered structure of at least two of the first to fourth regions, and a sixth region allowing light emitted by the light emitting unit to output without changing a wavelength of the light.

3. An image-based component measurement method using a light unit that outputs a variable wavelength, comprising:
selecting a component of a target object to be measured;
checking a wavelength band corresponding to the selected component;
adjusting, by a variable wavelength light emitter, a wavelength of the light unit to a checked wavelength band;
acquiring an image of the target object;
processing and analyzing the acquired image;
estimating content of the selected component according to an analysis result; and
outputting component content results,
wherein the variable wavelength light emitter comprises at least one light source, a wavelength changing film spaced apart from the at least one light source by a predetermined distance and comprising a plurality of regions, each of the plurality of regions corresponding to each of, each column of, or each row of the at least one light source, and a driving motor configured to change a region of the wavelength changing film illuminated by the light source, and
wherein the plurality of regions of the wavelength changing film are separated into rows or columns, and the driving motor is configured to move the wavelength changing film in a row or column direction to change the region of the wavelength changing film illuminated by the light source.

4. The image-based component measurement method according to claim 3, wherein, in the checking of the wavelength band corresponding to the selected component, a candidate group wavelength band is checked through document data or an experiment, if there is no wavelength band information on the selected component.

5. The image-based component measurement method according to claim 3, wherein each region of the wavelength changing film has quantum dots corresponding to a predetermined wavelength, and the wavelength changing film comprises at least one of
- a first region including a quantum dot for emitting red,
- a second region including quantum dot for emitting green,
- a third region including a quantum dot for emitting blue,
- a fourth region having at least two quantum dots for emitting red, green, and blue,
- a fifth having a layered structure of at least two of the first to fourth regions, and
- a sixth region allowing light emitted by the light emitting unit to output without changing a wavelength of the light.

6. The image-based component measurement method according to claim 3, wherein, in the acquiring of the image of the target object, the image of the target object is acquired in a state in which there is light having a wavelength necessary for analyzing a component to be measured, or the image of the target object is acquired in a state in which light disappears after the light is emitted from the variable wavelength light emitter.

7. The image-based component measurement method according to claim 3, wherein, the processing and analyzing of the acquired image comprises leaving only reflected light to be measured and removing noise through a preprocessing process of each image for each wavelength, and acquiring a reflectance for each measurement point for each wavelength.

8. The image-based component measurement method according to claim 3,
wherein, in the estimating of the content of the selected component, an absorption value or a reflection value of a specific wavelength and concentration (content) of the component has a correlation with respect to the selected component, and
wherein, in the estimating of the content of the selected component, the content of the selected component is estimated by being compared with existing data stored in a storage (database) or being inserted into a predetermined correlation equation.

* * * * *